United States Patent [19]

Schuermeyer et al.

[11] Patent Number: 5,192,698
[45] Date of Patent: Mar. 9, 1993

[54] MAKING STAGGERED COMPLEMENTARY HETEROSTRUCTURE FET

[75] Inventors: Fritz L. Schuermeyer, Yellow Springs; Paul E. Cook, Dayton, both of Ohio; Edgar J. Martinez, Charlottesville, Va.; Marino J. Martinez, Dayton, Ohio

[73] Assignee: The United State of America as represented by the Secretary of the Air Force, Washington, D.C.

[21] Appl. No.: 853,150

[22] Filed: Mar. 17, 1992

[51] Int. Cl.[5] .......................................... H01L 21/265
[52] U.S. Cl. ..................... 437/40; 437/22; 437/57; 437/56; 437/66; 437/126; 148/DIG. 65; 148/DIG. 72
[58] Field of Search ................ 437/40, 41, 22, 29, 437/34, 66, 57, 58, 126, 128, 129; 148/DIG. 72, DIG. 56, DIG. 65, DIG. 66; 357/22 A, 16, 56

[56] References Cited

U.S. PATENT DOCUMENTS

| 3,924,265 | 12/1975 | Rodgers | 148/DIG. 53 |
|---|---|---|---|
| 4,568,958 | 2/1986 | Baliga | 357/16 |
| 4,615,102 | 10/1986 | Suzuki et al. | 437/65 |
| 4,729,000 | 3/1988 | Abrokwah | |
| 4,732,870 | 3/1988 | Mimura | 437/133 |
| 4,791,072 | 12/1988 | Kiehl | 437/56 |
| 4,814,851 | 3/1989 | Abrokwah et al. | |
| 4,821,090 | 4/1989 | Yokoyama | 357/16 |
| 4,830,980 | 5/1989 | Hsieh | |
| 4,899,201 | 2/1990 | Xu et al. | |
| 4,937,474 | 6/1990 | Sitch | |
| 4,994,866 | 2/1991 | Awano | 357/16 |
| 5,001,536 | 3/1991 | Fukuzawa et al. | 357/22 A |
| 5,021,857 | 6/1991 | Suehiro | 357/56 |
| 5,031,007 | 7/1991 | Chaffin et al. | 357/22 A |

FOREIGN PATENT DOCUMENTS

| 0257669 | 10/1990 | Japan | 357/16 |
|---|---|---|---|
| 0296322 | 12/1990 | Japan | 437/179 |

Primary Examiner—Brian E. Hearn
Assistant Examiner—Michael Trinh
Attorney, Agent, or Firm—Bernard E. Franz; Donald J. Singer

[57] ABSTRACT

It is desirable to implement complementary field effect transistors in group III/group V compound semiconductors, especially on InP substrates. Outstanding n-channel performance has been demonstrated in InGaAs channel devices on InP substrates. Preliminary experiments indicate that GaAsSb channel devices will result in optimal p-heterostructure FETs (HFETs). This disclosure teaches a technique to fabricate both n- and p-channel devices on the same substrate, allowing the demonstration of (C-HFET) technology. The HFET structure contains a channel region and the barrier region. The channel region consists of two distinctive parts: the p-channel and the n-channel areas. The p-channel area consists of GaAsSb, lattice matched to the InP substrate. In n-channel FETs, and ohmic contacts are formed by first doping the contact areas with Si by ion implantation, annealing the structure and then depositing and annealing the ohmic metal. In the complementary FET p-channel FETs, BE ion implementation is used for formation of ohmic contacts.

4 Claims, 2 Drawing Sheets

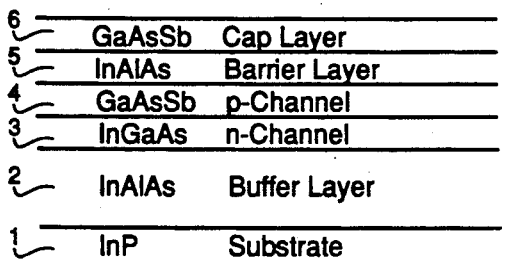
*Fig. 1* MBE grown heterostructure
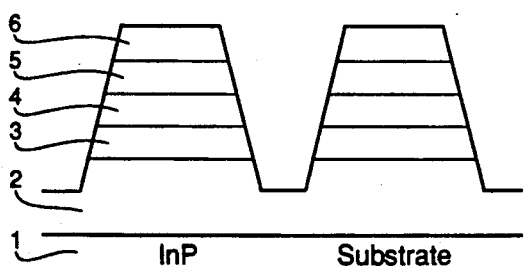
*Fig. 2* After mesa etching
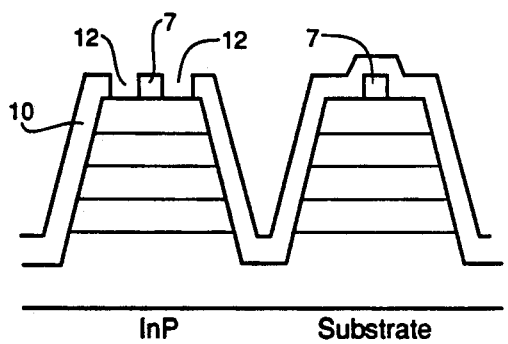
*Fig. 3* After refractive gate and photo resist deposition.
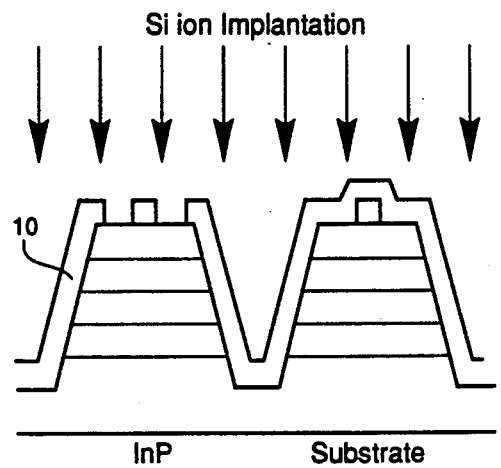
*Fig. 4* Si ion implantation and annealing for n-ohmic contacts.
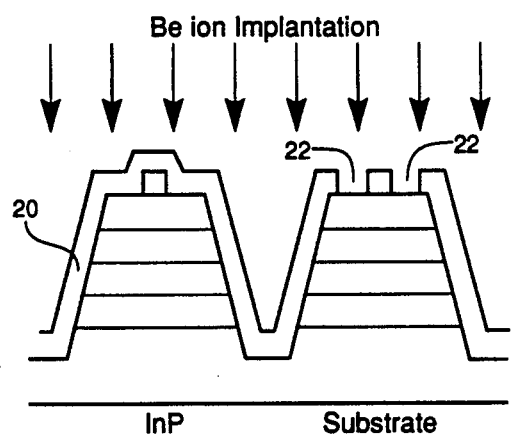
*Fig. 5* Be ion implantation and annealing for p-ohmic contacts.
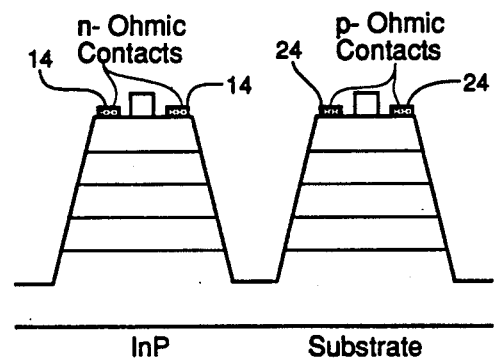
*Fig. 6* After formation of n- and p-ohmic contacts.

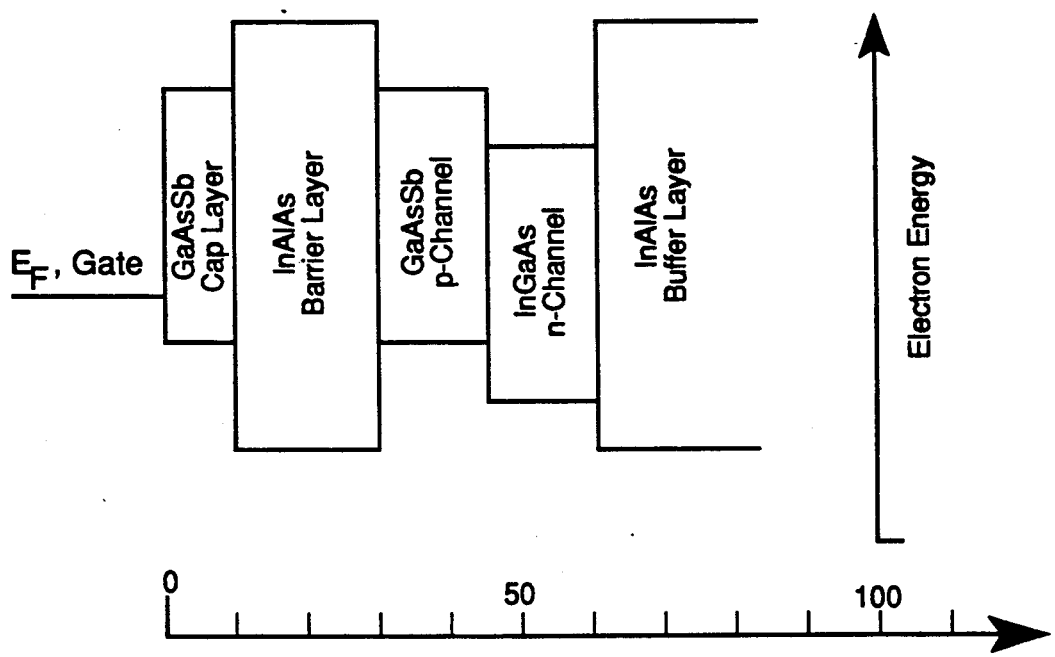
Fig. 7 Energy Band Diagram of Staggered HFET

MAKING STAGGERED COMPLEMENTARY HETEROSTRUCTURE FET

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a method of making staggered complementary heterostructure field effect transistors, and more particularly to a method to implement complementary circuits in group III/group V compound semiconductors.

During the last years, silicon CMOS circuits have become the leading technology in electronic systems. With significant advancement obtained in gallium arsenide (GaAs) and related compound materials, work on complementary circuits in these materials have become of interest and many companies and laboratories are advancing this technology. Best n-channel FETs have been demonstrated on InP substrates and it is desirable to develop complementary circuits in this technology.

CMOS technology, based on n- and p-channel Si FETs is well established. Complementary FET technology, based on GaAs material has been demonstrated in several laboratories, such as Honeywell SRC, IBM Research Center and AT&T Bell Labs. AT&T also demonstrated n- and p- channel devices in InGaAs channel structures on InP substrates. There exist several approaches for forming the transistors in the same layer structure. Honeywell pioneered the HIGFET approach where the same structure is used for both types of devices. Ion implantation is used to convert the basic structure into either an n- or p- channel device. In the selective regrowth approach one type of device is fabricated first. Then the area, allotted to the second type device is etched off and new material is selectively grown in this area. IBM is pursuing the stratified approach where material for both type devices is grown on top of each other. The top transistor is formed by implanting ohmic contact areas, forming ohmic contacts, and depositing the gates. The lower transistor is accessed by first etching off the material for the top transistor, then following the same procedure used for the top transistor. All complementary compound semiconductor ICs (Integrated Circuits) are currently in the research and development stage. The technology taught in this invention can be considered an extension of the HIGFET approach.

The following U.S. patents are of interest.
Sitch U.S. Patent No. 4,937,474
Xu et al U.S. Patent No. 4,899,201
Hsieh U.S. Patent No. 4,830,980
Abrokwah et al U.S. Patent No. 4,814,851
Abrokwah U.S. Patent No. 4,729,000

In particular, Abrokwah U.S. Patent No. 4,729,000 relates to a low power complementary (Al, Ga) As/GaAs heterostructure insulated gate field-effect transistor (HIGFET) wherein a pseudomorphic InGaAs semiconductor gate is used to reduce the HIGFET $V_t$. This patent further discloses an embodiment wherein Si was used to create the n+implanted regions and Mg or Be have each been used to form the p+implanted regions. The HIGFET utilizes two epitaxial layers grown on a semi-insulating GaAs wafer. Similarly, see the Abrokwah et al U.S. Patent No. 4,814,851 and the Hsieh U.S. Patent No. 4,830,980. The Xu et al U.S. Patent No. 4,899,201 relates to improved p-channel FETs and discloses a heterostructure FET formed by a narrow band gap substrate such as GaAs, InGaAs, InP or GeSi and thin wide band gap layer of AlGaS, InAlAs or Si dependent upon the particular material used for the substrate. This patent further discloses a HIGFET which can be either a p-channel or an n-channel device depending on whether the source and drain are p+or n+conductivity. The Sitch U.S. Patent No. 4,937,474 contains a reference to substitution of Si or InP MESFETs, or JFETs, HEMTs, HIGFETs or SISFETs for GaAs MESFETs described in detail.

SUMMARY OF THE INVENTION

An objective of the invention is to implement complementary heterostructure field effect transistor circuits in group III/group V compound semiconductors, especially on InP substrates.

This invention details an approach for fabrication of staggered complementary circuits on InP material. The disclosed principles will find application in other materials systems such as materials grown on GaSb substrates.

On a substrate of semi-insulating InP, molecular beam epitaxy is used to grow a semi-insulating buffer layer of InAlAs, a n-channel layer of InGaAs, a p-channel layer of GaAsSb, a barrier layer of InAlAs, and a top layer of GaAsSb as a cap layer to improve formation of ohmic contacts. All layers are lattice matched to the InP substrate.

Device fabrication starts with the mesa etching of the transistor areas. Then the refractory gate metal is deposited and delineated. The structure is covered with photo resist and the areas for n-ohmic contacts are opened. These areas are ion implanted with Si to obtain low resistance n-ohmic contacts. The photo resist is stripped and the sample is annealed to activate the n-typed dopants. The sample is again covered with photo resist and the p-ohmic contact areas are opened. The sample is then ion implanted with Be to obtain a high doping density in these areas. The photo resist is stripped and the sample annealed to activate the Be ions. Finally the p- and n- ohmic contacts are deposited and annealed. The typical n- ohmic metal system is AuGeNi while TiPtAu is used for formation of the p-ohmic contacts. The integrated circuit is completed by depositing and patterning the interconnect metal.

ADVANTAGES AND NEW FEATURES

There exist several approaches to forming n- and p-channel HFETs for complementary ICs. One approach is to grow first the structure for one type of transistor and then etch back the area for second type of transistor and selectively regrow this structure. Marginal success has been obtained with this approach. Another approach is based on the HIGFET (Heterostructure Insulated Gate Field Effect Transistor) where the same channel material is used for both types of transistors. In this approach, the channel material is optimal for one type of transistor and marginal for the other type. In the stratified approach, the structures for one type of transistor is grown on top of that of the other transistor. The concern of this approach is that the bottom structure interferes with the top transistor. The staggered HFET, taught in this invention allows the use of the optimal channel material for each type of transistor. The material are optimized to yield the highest carrier mobilities as well as the highest valence and conduction band discontinuities. There exists no need for selective regrowth of the structure. The staggered HFET approach provides the best method to obtain complementary HFET circuits.

BRIEF DESCRIPTION OF THE DRAWING

FIG. 1 is a diagram showing a MBE grown heterostructure;

FIGS. 2-6 show steps in the formation of the heterostructure; and

FIG. 7 is an energy band diagram of a staggered HFET.

DETAILED DESCRIPTION

The following is a description of the preferred embodiment of the staggered HFET for complementary circuit application. FIG. 1 shows the materials structure grown by MBE (Molecular Beam Epitaxy). The substrate 1 is semi-insulating InP. A semi-insulating InAlAs buffer layer 2 of approximately one micrometer is grown, followed by a 15-nanometer thick InGaAs layer 3 and a 15-nanometer thick GaAsSb layer 4. A 30-nanometer thick InAlAs barrier layer 5 follows. The top layer 6 is a 50-nanometer thick GaAsSb cap layer to improve formation of ohmic contacts. All layers are lattice matched to the InP substrate.

In FIG. 2, device fabrication starts with the mesa etching of the transistor areas.

Then, in FIG. 3, the refractory gate metal WN (tungsten nitride) 7 is deposited and delineated. The structure is covered with photo resist 10 and the areas 12 for n-ohmic contacts are opened.

In FIG. 4, these areas 12 are ion implanted with Si to obtain low resistance n-ohmic contacts. The photo resist is stripped and the sample is annealed to activate the n-typed dopants.

In FIG. 5, the sample is again covered with photo resist 20 and the p-ohmic contact areas 22 are opened. The sample is then ion implanted with Be to obtain a high doping density in these areas. The photo resist is stripped and the sample annealed to activate the Be ions.

Finally, in FIG. 6, the p- and n- ohmic contacts 14 and 24 respectively are deposited and annealed. The typical n- ohmic metal system is AuGeNi while TiPtAu is used for formation of the p-ohmic contacts. The integrated circuit is completed by depositing and patterning the interconnect metal.

The following discusses the physics of the staggered HFET. The band diagram of the staggered HFET is shown in FIG. 7. At the left side is shown the fermi level of the gate metal. This is followed by the GaAsSb cap layer, the InAlAs barrier layer, the GaAsSb p-channel layer, the InGaAs n-channel layer and finally the InAlAs buffer layer. In this diagram all layers are undoped. From published data on the band edge alignment of GaAs, AlAs, InAs, and GaSb the band edge energies for ternary compounds, lattice matched to InP can be calculated. These calculations show that the GaAsSb layer in combination with the InAlAs barrier layer and the InGaAs n-channel layer form a quantum well for holes. Similarly, the InGaAs layer in conjunction with the GaAsSB p-channel layer and the InAlAs buffer layer form a quantum well for electrons. In this structure the InAlAs layers contain an InAs mole fraction of 0.48, the GaAsSb layer a GaAs mole fraction of 0.51 and the InGaAs layer an InAs mole fraction of 0.53. With known hole mobilities of 850 and 400 $cm^2$/V-sec. for GaSb and GaAs respectively, the hole mobility of the GaAsSb layer is estimated to be 620 $cm^2$/V-sec. Similarly, the known electron mobilities of 8500 and 33000 $cm^2$/V-sec. for GaAs and InAs respectively result in an electron mobility of 21500 $cm^2$/V-sec. for the InGaAs layer. The hole quantum well in the GaAsSb layer in conjunction with the high hole mobility form the channel area for the p-HFET. Similarly, the InGaAs electron quantum well in conjunction with the high mobility form a superb channel area for n-HFET. Due to the high hole and electron mobilities, the performance of these transistors will be excellent. The calculations predict that the threshold voltage of the n-channel device is approximately 0.5 V while the threshold voltage of the p-channel device is approximately 0 V. To achieve threshold voltages of 0.3 V for the n-channel device and $-0.3$ V for the p-channel device, the InGaAs material should be Si doped to a level of $2*10^{17}$ $cm^{-3}$.

ALTERNATIVES

There exist many variations to this preferred embodiment. Examples are the use of strained GaAsSb and InGaAS layers as well as the use of GaSb and InAs channels on GaSb substrates.

There exist several approaches for isolating the transistors. Instead of mesas, the transistor areas may be isolated by doping with oxygen, or by damaging by ion implanting protons.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A method of integrated circuit fabrication for forming staggered complementary heterostructure field effect transistors on the same wafer substrate, comprising:

epitaxially growing a semi-insulating buffer layer of InAlAs approximately one micrometer on the substrate of semi-insulating InP;

epitaxially growing a n-channel layer of InGaAs approximately 15-nanometer thick;

epitaxially growing a p-channel layer of GaAsSb approximately 15-nanometer thick;

epitaxially growing a barrier layer of undoped InAlAs approximately 30-nanometer thick;

epitaxially growing a top layer of GaAsSb approximately 50-nanometer thick as a cap layer to improve formation of ohmic contacts; all layers being lattice matched to the InP substrate;

etching said layers to form a structure having mesas down into said first layer for n-channel and p-channel transistor areas;

depositing and delineating a refractory metal for a gate on each of the mesas;

covering the structure with a first photo resist and opening areas for n-ohmic contacts on the mesas for the n-channel transistor areas;

ion implanting the areas for n-ohmic contacts with Si ions to obtain low resistance n-ohmic contacts, stripping the first photo resist, and annealing to activate the Si ions;

covering the structure with a second photo resist and opening areas for p-ohmic contacts on the mesas for p-channel transistor areas;

ion implanting the areas for p-ohmic contacts with Be ions to obtain a high doping density in these areas, stripping the second photo resist, and annealing to activate the Be ions;

depositing and annealing P-ohmic and n-ohmic metal contacts respectively on the p-ohmic and n-ohmic areas;

depositing and patterning interconnect metal to complete the integrated circuit.

2. A method of integrated circuit fabrication for forming staggered complementary heterostructure field effect transistors on the same wafer substrate, comprising:

providing a wafer having a substrate of semi-insulating InP on which there is a semi-insulating buffer layer of InAlAs, followed by a n-channel layer of InGaAs, followed by a p-channel layer of GaAsSb, followed by a barrier layer of undoped InAlAs, followed by a top layer of GaAsSb as a cap layer to improve formation of ohmic contacts, all said layers being epitaxially grown and lattice matched to the InP substrate;

forming a structure having isolated areas for n-channel and p-channel transistor areas by etching said layers;

depositing and delineating a refractory metal for a gate on each of the isolated areas;

covering the structure with a first photo resist and opening areas for n-ohmic contacts on the isolated areas for the n-channel transistor areas;

ion implanting the areas for n-ohmic contacts with Si ions to obtain low resistance n-ohmic contacts, stripping the first photo resist, and annealing to activate the Si ions;

covering the structure with a second photo resist and opening areas for p-ohmic contacts on the isolated areas for p-channel transistor areas;

ion implanting the areas for p-ohmic contacts with Be ions to obtain a high doping density in these areas, stripping the second photo resist, and annealing to activate the Be ions;

depositing and annealing p-ohmic and n-ohmic metal contacts respectively on the p-ohmic and n-ohmic areas;

depositing and patterning interconnect metal to complete the integrated circuit.

3. A method of integrated circuit fabrication for forming staggered complementary heterostructure field effect transistors on the same wafer substrate, comprising:

providing a wafer having a substrate of a semi-insulating compound of a group III and a group V element, on which there is a semi-insulating buffer layer, followed by a n-channel layer, followed by a p-channel layer, followed by an undoped barrier layer, followed by a top layer as a cap layer to improve formation of ohmic contacts, all said layers being epitaxially grown of compounds of group III and group V elements and lattice matched to the substrate;

forming a structure having isolated areas for n-channel and p-channel transistor areas by etching said layers;

depositing and delineating a refractory metal for a gate on each of the isolated areas;

covering the structure with a first photo resist and opening areas for n-ohmic contacts on the isolated areas for the n-channel transistor areas;

ion implanting the areas for n-ohmic contacts with Si ions to obtain low resistance n-ohmic contacts, stripping the first photo resist, and annealing to activate the Si ions;

covering the structure with a second photo resist and opening areas for p-ohmic contacts on the isolated areas for p-channel transistor areas;

ion implanting the areas for p-ohmic contacts with Be ions to obtain a high doping density in these areas, stripping the second photo resist, and annealing to activate the Be ions;

depositing and annealing p-ohmic and n-ohmic metal contacts respectively on the p-ohmic and n-ohmic areas;

depositing and patterning interconnect metal to complete the integrated circuit.

4. A method of integrated circuit fabrication according to claim 3, wherein the substrate is of GaSb, and the channel layers are grown with GaSb and InAs.

* * * * *

UNITED STATES PATENT AND TRADEMARK OFFICE
CERTIFICATE OF CORRECTION

PATENT NO.   :   5,192,698
DATED        :   March 9, 1993
INVENTOR(S)  :   Fritz L. Schuermeyer et al It is certified that error appears in the above-identified patent and that said Letters Patent is hereby corrected as shown below:

ON THE TITLE PAGE:

Abstract, line 15, "and" should be -- the --.

Column 5, line 13, "P-ohmic" should be -- p-ohmic --.

Signed and Sealed this

Twenty-fifth Day of January, 1994

*Attest:*

BRUCE LEHMAN

*Attesting Officer*     *Commissioner of Patents and Trademarks*